United States Patent [19]
Lee

[11] Patent Number: 5,986,334
[45] Date of Patent: Nov. 16, 1999

[54] SEMICONDUCTOR PACKAGE HAVING LIGHT, THIN, SIMPLE AND COMPACT STRUCTURE

[75] Inventor: Seon Goo Lee, Seoul, Rep. of Korea

[73] Assignees: Anam Industrial Co., Ltd., Rep. of Korea; Amkor Electronics, Inc., Chandler, Ariz.

[21] Appl. No.: 08/942,784

[22] Filed: Oct. 2, 1997

[30] Foreign Application Priority Data

Oct. 4, 1996 [KR] Rep. of Korea ............... 96-43843
Oct. 18, 1996 [KR] Rep. of Korea ............... 96-46656

[51] Int. Cl.⁶ .................. H01L 23/495; H01L 23/48
[52] U.S. Cl. .................... 257/667; 257/692; 257/696
[58] Field of Search ........................... 257/667, 692, 257/758, 696

[56] References Cited

U.S. PATENT DOCUMENTS

| | | | |
|---|---|---|---|
| 4,534,105 | 8/1985 | Reusch | 29/589 |
| 5,198,886 | 3/1993 | Verspeek et al. | 257/727 |
| 5,331,203 | 7/1994 | Wojnarowski et al. | 257/698 |
| 5,583,370 | 12/1996 | Higgins, III et al. | 257/667 |
| 5,684,330 | 11/1997 | Lee | 257/692 |
| 5,821,615 | 10/1998 | Lee | 257/686 |

*Primary Examiner*—Teresa M. Arroyo
*Attorney, Agent, or Firm*—Skjerven, Morrill, MacPherson, Franklin & Friel LLP

[57] ABSTRACT

A semiconductor package having a light, thin, simple and compact structure including outer leads having a minimum length and a resin encapsulate having a minimum volume. The semiconductor package includes a package body, a semiconductor chip mounted on a central portion of the body, inner and outer leads bonded to a peripheral portion of an upper surface of the body by an insulating layer in such a manner that the leads are supported on the body, conductive wires or bumps for electrically connecting the inner leads to the semiconductor chip, a resin encapsulate for encapsulating the semiconductor chip, the conductive wires or bumps and the inner leads. Each outer lead has an end positioned at a level higher than an upper surface of the semiconductor chip so that a boundary portion defined between the associated outer and inner leads serves as a barrier for the resin encapsulate. The end of each outer lead is exposed outside the resin encapsulate and extending to a peripheral edge of the body.

30 Claims, 6 Drawing Sheets

SEMICONDUCTOR PACKAGE HAVING LIGHT, THIN, SIMPLE AND COMPACT STRUCTURE

BACKGROUND OF THE INVENTION

1. Field of the Invention

The present invention relates to a semiconductor package having a light, thin, simple and compact structure, and more particularly to a semiconductor package having a light, thin, simple and compact structure in which outer leads extending outside a resin encapsulate are supported on a package body, thereby enabling the outer leads to have a minimum length while minimizing the volume of the resin encapsulate to maximize the mounting density of the semiconductor package on a main board and to achieve an improvement in the heat discharge efficiency.

2. Description of the Prior Art

Generally, semiconductor packages are known as electronic devices having an encapsulate for encapsulating a semiconductor chip, such as a single device formed with a variety of electronic circuits and lines, an integrated circuit or a hybrid circuit, while having signal input/output terminals connected to a main board in order to protect the semiconductor chip from harmful environments, such as dust, moisture, electrical loads and mechanical impact, while optimizing and maximizing the performance of the semiconductor chip.

Semiconductor packaging techniques have been developed along with developments of semiconductor chips. Hermetic packaging techniques using ceramic or cans made of a metal material have been mainly used in the early stages of development. However, such hermetic packaging techniques have a limitation in satisfying the super-high performance tendency of semiconductor chips and a demand for high productivity resulting from an abrupt increase in a demand for semiconductor chips. To this end, a plastic packaging technique has been mainly used. In accordance with the plastic packaging technique, a lead frame is used. An epoxy molding compound is also used to encapsulate semiconductor chips.

The lead frame is a member not only serving as a lead for electrically connecting input/output pads of a semiconductor chip to an electrical circuit formed on a main board, but also serving as a frame for fixing an associated semiconductor package to the main board. The epoxy molding compound, in particular, thermosetting epoxy resin, is mainly used as an encapsulate material for encapsulating semiconductor chips because it is inexpensive while exhibiting a high productivity even though it exhibits inferior thermal stability and inferior reliability as compared to ceramic.

FIG. 10A is a plan view illustrating a general lead frame having a conventional structure whereas FIG. 10B is a partially-broken perspective view illustrating a quad flat package (QFP) type semiconductor package fabricated using the lead frame of FIG. 10A. In addition to such a QFP semiconductor package, a variety of packages are known. For example, a dual inline package (DIP) and a single inline package (SIP) are known. All of these packages are similar in their basic structures in that they have leads outwardly protruded from outer surfaces thereof, respectively. The above-mentioned packages are distinguished from one another by their structures respectively having leads protruded from four side package surfaces, leads protruded from opposite two side package surfaces and leads protruded from only one side package surface. Accordingly, the following description will be described only in conjunction with QFP type semiconductor packages.

The lead frame denoted by the reference numeral 100' in FIG. 10A includes a semiconductor chip mounting plate 140' for mounting a semiconductor chip (not shown) thereon, a plurality of tie bars 110' for supporting the semiconductor chip mounting plate 104', and a plurality of inner leads 130' and a plurality of outer leads 120' provided around the semiconductor chip mounting plate 140'.

FIG. 10B illustrates a semiconductor package 200' formed using a lead frame having the same structure as the above-mentioned conventional lead frame 100'. As shown in FIG. 10B, the semiconductor package 200' includes a semiconductor chip 210' laminated with a variety of desired electrical or electronic circuits and lines and formed at the upper surface thereof with a plurality of input/output pads 240'. The semiconductor chip 210 is mounted on a semiconductor chip mounting plate 140', which is a constituting element of the lead frame, by means of an adhesive layer. The semiconductor package 200' also includes tie bars 110' for supporting the semiconductor chip mounting plate 140', and a plurality of inner leads 130' electrically connected to the input/output pads 240' of the semiconductor chip 210' as input/output terminals by means of conductive wires 230'. Each inner lead 130' is provided at its tip portion with a finger plated with silver to achieve a good wire bonding thereof. The semiconductor package 200' further includes a resin encapsulate 220' molded to encapsulate the semiconductor chip 210', conductive wires 230' and inner leads 130', and a plurality of outer leads 120' formed integrally with the inner leads 130' while extending outwardly around the four side surfaces of the resin encapsulate 220'. The outer leads 120' serve as external connecting terminals (pins) of the package. A thermally conductive plate 250' may be provided on the lower surface of the semiconductor chip mounting plate 140' in order to easily discharge heat generated at the semiconductor chip 210' from the package.

Referring to FIG. 10A, dam bars 150' are shown which are cut in accordance with a trimming process after the molding of the resin encapsulate 220'. In order to improve the bonding force required to mount the semiconductor package 200' to a main board (not shown), the outer leads 120' of the semiconductor package 200' are coated with lead/tin (Pb/Sn) using a solder plating process. The plated outer leads 120' are also bent to have a desired shape, using a forming process.

In the conventional semiconductor package 200' having the above-mentioned structure, the outer leads 120', which are formed by cutting the dam bars 150' using the trimming process, extend outwardly from the four side surfaces of the resin encapsulate 220' at a middle position between the upper and lower surfaces of the resin encapsulate 220'. For this reason, each outer lead 120' should be bent at its outer end thereof using the forming process to have a desired shape so that the outer end of the outer lead 120' is flush with the upper or lower surface of the semiconductor package 200' for its electrical connection to a main board (not shown). To this end, it is necessary for the outer leads 120' to have a relatively large length. As a result, the outer leads 120' have a structure considerably protruded from the resin encapsulate 220'. Where the semiconductor package 200' having such a structure is mounted on a main board, a reduction in the mounting density occurs. Furthermore, a reduction in the design margin for electrical patterns formed on the main board occurs.

In the above-mentioned semiconductor package, the resin encapsulate 220' adapted to encapsulate the semiconductor chip and peripheral elements around the semiconductor chip has a considerably large volume as compared to the semiconductor chip 210'. As a result, there is a degradation in the heat discharge efficiency.

The semiconductor package 200' also has a limitation in increasing the number of its outer leads 120' serving as external connecting terminals because the outer leads 120' are protruded from only the side surfaces of the package 200'. As a result, there is a limitation in designing circuits and lines of the semiconductor chip.

Consequently, conventional semiconductor packages have a problem in that they can not satisfy two conflicting requirements for portable telephones, notebook computers and pagers, namely, the requirement to provide a high performance and high integration of semiconductor chips and the requirement to provide a light, thin, simple and compact package structure.

SUMMARY OF THE INVENTION

Therefore, a first object of the invention is to provide a semiconductor package having a light, thin, simple and compact structure including outer leads having a minimum length and a resin encapsulate having a minimum volume.

A second object of the invention is to provide a semiconductor package having a light, thin, simple and compact structure capable of accomplishing the first object of the invention and achieving an improvement in the heat discharge efficiency.

A third object of the invention is to provide a semiconductor package having a light, thin, simple and compact structure including outer leads having a minimum length and a resin encapsulate having a minimum volume while having inner leads extending inwardly along the lower surface of an associated semiconductor chip, thereby being capable of optionally setting the positions of input/output pads on the semiconductor chip and achieving an increase in the number of those leads.

A fourth object of the invention is to provide a semiconductor package having a light, thin, simple and compact structure capable of accomplishing the third object of the invention and achieving an improvement in the heat discharge efficiency.

In accordance with one aspect, the present invention provides a semiconductor package comprising: a package body; a semiconductor chip mounted on a central portion of the body; inner and outer leads bonded to a peripheral portion of an upper surface of the body by an insulating layer in such a manner that the leads are supported on the body; electrical connection means for electrically connecting the inner leads to the semiconductor chip; a resin encapsulate for encapsulating the semiconductor chip, the electrical connection means and the inner leads; and each of the outer leads having an end positioned at a level higher than an upper surface of the semiconductor chip so that a boundary portion defined between the associated outer and inner leads serves as a barrier for the resin encapsulate, the end of the outer lead being exposed outside the resin encapsulate and extending to a peripheral edge of the body.

In accordance with another aspect, the present invention provides a semiconductor package comprising: a semiconductor chip; a flat package body centrally defined with a semiconductor chip mounting region, the body having an area larger than the semiconductor chip; first leads bonded to a peripheral portion of the body by means of an insulating layer in such a manner that upper surfaces thereof are positioned at a desired level, respectively; second leads bonded to respective peripheral portions of the first leads by an insulating layer having conductive via holes in such a manner that upper surfaces thereof are positioned at a desired level, the second leads being electrically connected to the first leads via the conductive via holes and having ends corresponding to outer ends of the first leads, respectively; conductive wires for electrically connecting the first leads to the semiconductor chip; a resin encapsulate for protecting the semiconductor chip, the conductive via holes, and the conductive wires from the environment; and the ends of the second leads being positioned at a level higher than an upper surface of the semiconductor chip so that a boundary portion defined between the associated first and second leads serves as a barrier for the resin encapsulate, the ends of the second leads being also exposed outside the resin encapsulate and extending to a peripheral edge of the body.

In accordance with another aspect, the present invention provides a semiconductor package comprising: a semiconductor chip; a flat package body centrally defined with a semiconductor chip mounting region, the body having an area larger than the semiconductor chip; a printed circuit board bonded to a peripheral portion of the body outside the semiconductor chip mounting region in such a manner that an upper surface thereof is positioned at a desired level, the printed circuit board having first and second conductive traces laminated together and an insulating layer interposed between the first and second conductive traces and provided with conductive via holes adapted to electrically connect the first and second conductive traces to each other; conductive wires for electrically connecting the second traces to the semiconductor chip; a resin encapsulate for protecting the insulating layer, the first conductive traces, the semiconductor chip, and the conductive wires from the environment; and the ends of the second traces being positioned at a level higher than an upper surface of the semiconductor chip so that a boundary portion defined between the associated first and second traces serves as a barrier for the resin encapsulate, the ends of the second traces being also exposed outside the resin encapsulate and extending to a peripheral edge of the body.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1A:
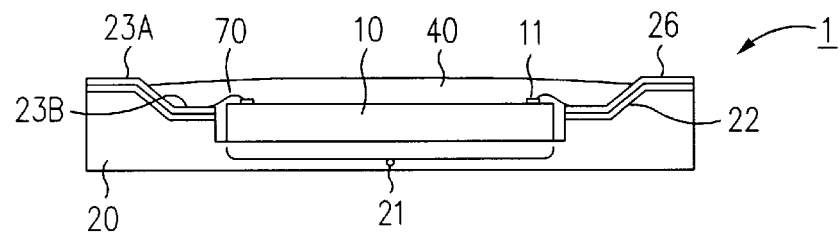
FIG. 1A is a sectional view of a typical structure of a semiconductor package according to a first embodiment of the present invention.

Referring to FIGS. 1 to 5, a semiconductor package is illustrated which has a structure according to a first embodiment of the present invention in order to accomplish the first object of the present invention.

The semiconductor package of the first embodiment, which is denoted by the reference numeral 1, includes a package body 20, a semiconductor chip 10 mounted on a central portion of the body 20, and outer and inner leads 23A and 23B supported on the upper surface of the body 20. An insulating layer 26 is interposed between the body 20 and each lead 23A or 23B. The semiconductor package 1 also includes conductive wires 70 for electrically connecting the inner leads 23B to input/output pads 11 of the semiconductor chip 10, respectively, and a resin encapsulate 40 for encapsulating the semiconductor chip 10, conductive wires 70 and inner leads 23B. The outer end of each outer lead 23A is positioned at a level higher than the upper surface of the semiconductor chip 10 so that the boundary portion between the associated outer and inner leads 23A and 23B (namely, an inclined lead portion 22) serves as a barrier, i.e., the margin of or border of the resin encapsulate 40. The outer end of each outer lead 23A extends to the outer edge of the body 20.

Figure 1B:
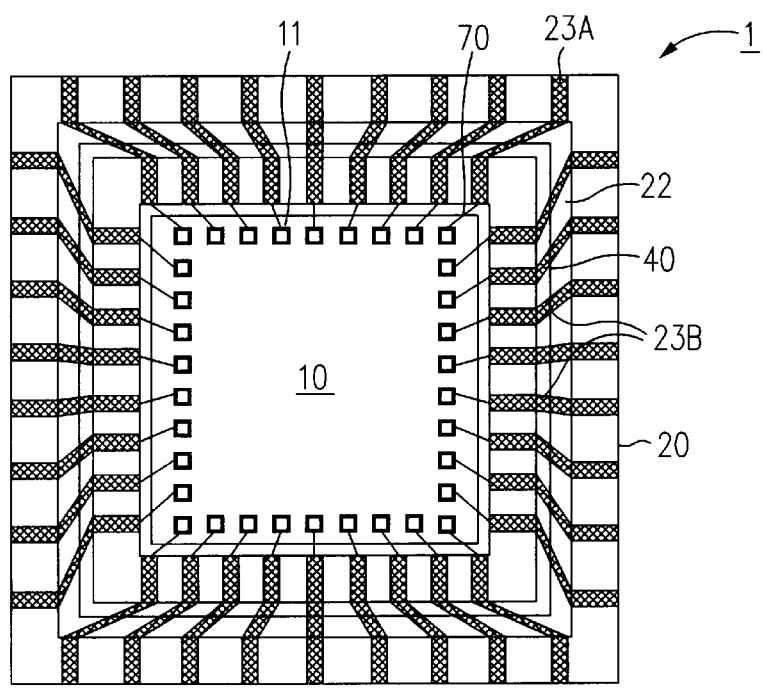
FIG. 1B is a plan view of the package structure shown in FIG. 1A.

FIG. 1A is a sectional view of a typical structure of the semiconductor package 1 according to the first embodiment of the present invention whereas FIG. 1B is a plan view of the package structure shown in FIG. 1A.

As shown in FIGS. 1A and 1B, this package structure includes a package body 20 provided at a central portion thereof with a recess 21 adapted to mount a semiconductor chip 10 therein. The package body 20 also has an inclined surface 22 at its portion disposed around the recess 21 while being outwardly spaced from the recess 21. The package structure also includes outer and inner leads 23A and 23B supported on a portion of the body 20 except for the recess 21 in such manner that an insulating layer 26 is interposed between the body 20 and each lead 23A or 23B. The package structure further includes the semiconductor chip 10 mounted in the recess 21, conductive wires 70 for electrically connecting the semiconductor chip 10 to the outer and inner leads 23A and 23B, and a resin encapsulate 40 molded in a region defined by an inclined surface 22.

The recess 21 of the body 20 has an area slightly larger than the semiconductor chip 10 so as to mount the semiconductor chip 10 therein. The inclined surface 22 is provided around the recess 21 while being outwardly spaced from the peripheral edge of the recess 21 by a desired distance. The body 20 also has an outer portion having a flat upper surface extending outwardly around the inclined surface 22. Accordingly, the body 20 has a thickness gradually increasing in the order of the portion corresponding to the central recess 21, the portion disposed between the central recess 21 and the inclined surface 22, the portion corresponding to the inclined surface 22, and the portion disposed around the inclined surface 22. In the illustrated case, the recess 21 has a vertical side wall perpendicular to the lower surface of the body 20.

Preferably, the body 20 is made of a metal exhibiting a high thermal conductivity, such as aluminum, copper, or copper alloy, in order to obtain an improvement in the heat discharge efficiency. However, the body 20 is limited to such a material. The body 20 may be made of ceramic or polymer resin.

The semiconductor chip 10, which is laminated with a variety of desired electronic circuits and lines and provided at its upper surface with input/output pads 11, is mounted in the central recess 21 of the body 20 by means of an adhesive. The upper surface of the semiconductor chip 20 mounted in the recess 21 is positioned at a level within a level range of the inclined surface 22.

The inner and outer leads 23B and 23A extend outwardly along an upper surface portion of the body 20 except for the recess 21 under the condition in which the insulating layer 26 is interposed between the upper surface portion of the body 20 and each lead 23A or 23B. The insulating layer 26 may be formed by coating an electrical insulating material on the body 20 or attaching an electrical insulating tape to the body 20. It is desirable in terms of the process efficiency that the insulating layer 26 is comprised of a double-faced electrical insulating tape. Where an electrical insulating tape is used for the insulating layer 26, it is desirable that the electrical insulating tape has a high flexibility. In this case, it is possible to easily and accurately shape the outer and inner leads 23A and 23B to have a shape corresponding to the profile of the upper surface of the body 20.

The inner and outer leads are integral with each other. In this specification, accordingly, the outer leads 23A define lead portions disposed around the resin encapsulate 40 whereas the inner leads 23B define lead portions disposed in the resin encapsulate 40.

The end of each inner lead 23B adjacent to the semiconductor chip 10 is electrically connected to an associated input/output pad 11 of the semiconductor chip 10 by a conductive wire 70. This inner lead end is plated with silver in order to achieve an easy bonding. Typically, the conductive wires 70 are comprised of gold (Au) wires in order to minimize contact resistance generated at bonding areas.

The semiconductor chip 10, conductive wires 70 and inner leads 23B are protected from the environment by the resin encapsulate 40 which is molded using an epoxy molding compound.

Preferably, the outer leads 23A, which are exposed around the resin encapsulate 40 and supported on the upper surface of the body 20 while being used as input/output terminals of the semiconductor package 1, is plated with solder so as to achieve an easy mounting of the semiconductor package 1 on a main board 90 while increasing the electrical conductivity thereof. It should be noted that the outer end of each outer lead 23A extends to the peripheral edge of the body 20 so that it does not protrude outwardly beyond the body 20. Accordingly, the mounting density of the semiconductor package 1 on the main board 90 increases.

Figure 1C:
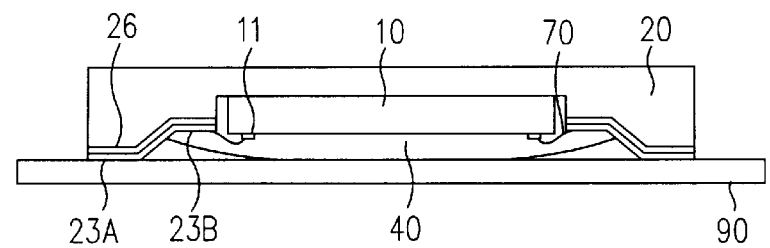
FIG. 1C is a sectional view illustrating a state in which the semiconductor package of FIG. 1A is mounted on a main board.

FIG. 1C is a sectional view illustrating a state in which the semiconductor package 1 is mounted on the main board 90. In order to minimize the mounting area, the semiconductor package 1 is mounted in an inverted state on the main board 90 in such a manner that the flat outer ends of the outer leads 23A are in direct contact with lines formed on the main board 90. Since the outer leads 23A have a minimum length not extending outwardly beyond the body 20, the mounting density of the semiconductor package 1 on the main board 90 is maximized. A sufficient mechanical strength is also obtained in the state in which the semiconductor package 1 is mounted on the main board 90 because the outer leads 23A are firmly supported on the body 20. The mechanical strength can be enhanced where the upper surface of the resin encapsulate 40 is flush with the upper surfaces of the outer leads 23A.

Figure 2:
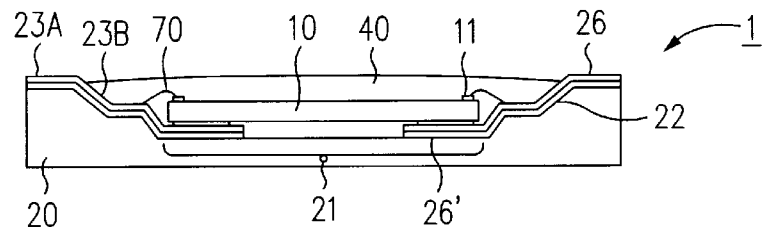
FIG. 2 is a sectional view illustrating a modified structure of the semiconductor package according to the first embodiment of the present invention.

FIG. 2 is a sectional view illustrating a modified structure of the semiconductor package 1 according to the first embodiment of the present invention. This package structure is basically identical to that of FIGS. 1A and 1B except that: the recess 21 of the package body 20 has an outwardly inclined side wall; each inner lead 23B bonded to the upper surface of the body 20 by means of the insulating layer 26 has an inner end extending inside the recess 21; and the semiconductor chip 10 is bonded to the exposed surfaces of the inner ends of the inner leads 23B by means of an insulating layer 26'.

The insulating layer 26' may be made of the same material as that of the insulating layer 26. If necessary, the insulating layer 26' may be made of an adhesive resin exhibiting a high thermal conductivity, such as a silver-filled epoxy resin.

Figure 3:
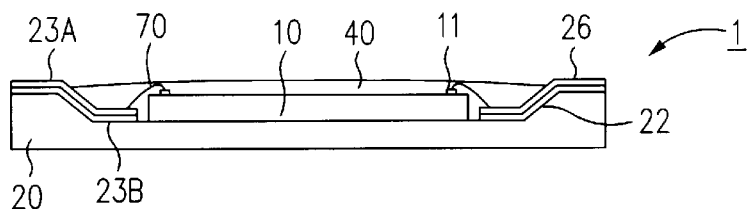
FIG. 3 is a sectional view illustrating another modified structure of the semiconductor package according to the first embodiment of the present invention.

FIG. 3 is a sectional view illustrating another modified structure of the semiconductor package 1 according to the first embodiment of the present invention. This package structure is basically identical to that of FIGS. 1A and 1B except that the package body 20 has a structure including no recess for mounting the semiconductor chip 10, namely, a structure including a flat inner portion and an outer portion having a thickness larger than the inner portion. In this case, the semiconductor chip 10 is centrally mounted on the inner portion of the package body 20. The package body 20 also has an inclined surface 22 between the inner and outer portions thereof. Each inner lead 23B supported on the upper surface of the body 20 has an inner end bonded to the upper surface of the inner portion of the body 20 outside the region, where the semiconductor chip 10 is mounted, by means of the insulating layer 26. Each outer lead 23A integral with an associated inner lead 23B extends outside the resin encapsulate 40. The connecting portion between the inner and outer leads is laid on the inclined surface 22 of the body 20.

Figure 4A:
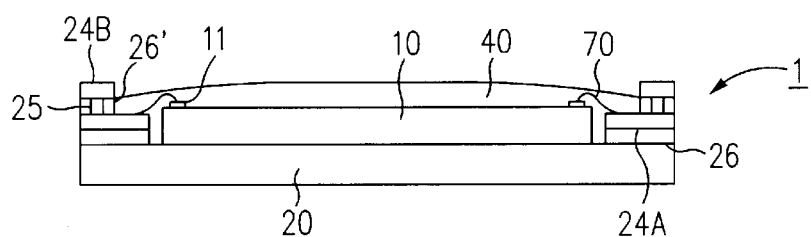
FIG. 4A is a sectional view illustrating another modified structure of the semiconductor package according to the first embodiment of the present invention.

FIG. 4A is a sectional view illustrating another modified structure of the semiconductor package 1 according to the first embodiment of the present invention. This package structure is basically identical to that of FIGS. 1A and 1B except that the package body 20 has a flat structure in order to solve an inconvenience in the fabrication of the package body having the recess 21 and/or the inclined surface 22 as in the above-mentioned package structures of FIGS. 1 to 3. In this case, first leads 24A are bonded to a peripheral portion of the package body 20 by means of an insulating layer 26 in such a manner that their upper surfaces are positioned at a desired level, respectively. A second lead 24B is bonded to a peripheral portion of each first lead 24A by means of an insulating layer 26' having a conductive via hole 25 in such a manner that its upper surface is positioned at a desired level.

The body 20 has a flat upper surface having an area larger than the semiconductor chip 10. The semiconductor chip 10 is centrally mounted on the flat upper surface of the body 20. Each second lead 24B is electrically connected to an associated one of the first leads 24A via an associated one of the conductive via holes 25. The second lead 24B has an outer end extending to the outer end of the associated first lead 24A. The first leads 24A disposed around the semiconductor chip 10 are electrically connected to the semiconductor chip 10 by conductive wires 70. This package structure also includes a resin encapsulate 40 for protecting the first leads 24A, conductive via holes 25, semiconductor chip 10 and conductive wires 70 from the environment.

The body 20 may be made of a metal exhibiting a high thermal conductivity, ceramic or polymer resin, as in the case of FIGS. 1A and 1B.

The insulating layers 26 and 26' may be formed by coating an electrical insulating material on the body 20 or attaching an electrical insulating tape to the body 20. However, it is desirable in terms of the process efficiency that the insulating layers 26 and 26' are comprised of a double-faced electrical insulating tape. Where an electrical insulating tape is used for the insulating layer 26, it is unnecessary for the electrical insulating tape to have a high flexibility because the electrical insulating tape is attached to the flat upper surface of the body 20. The insulating layer 26', which has an area smaller than the insulating layer 26, should be comprised of an insulating layer formed with a via hole in order to electrically connect the first and second leads 24A and 24B.

The inner end of each first lead 24A adjacent to the semiconductor chip 10 is electrically connected to an associated input/output pad 11 by an associated one of the conductive wires 70. This inner lead end is plated with silver in order to achieve an easy bonding. Typically, the conductive wires 70 are comprised of Au wires in order to minimize contact resistance generated at bonding areas.

The semiconductor chip 10, conductive wires 70 and first leads 24A and via holes 25 are protected from the environment by the resin encapsulate 40. The resin encapsulate 40 has an upper surface flush with the upper surface of the insulating layer 26' on which the second leads 24B are laid. Accordingly, the second leads 24B are exposed around the resin encapsulate 40 and supported on the upper surface of the body 20. Preferably, the exposed surface of each second lead 24B is plated with solder so as to achieve an easy mounting of the semiconductor package 1 on a main board 90 while increasing the electrical conductivity thereof.

In this case, it should be noted that the outer ends of the first and second leads 24A and 24B extend to the peripheral edge of the body 20 so that they do not protrude outwardly beyond the body 20. Accordingly, the mounting density of the semiconductor package 1 on the main board 90 increases.

Figure 4B:
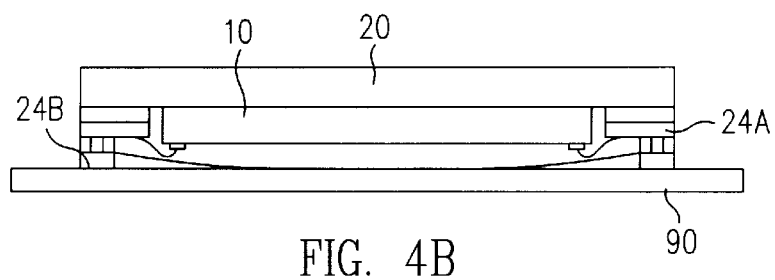
FIG. 4B is a sectional view illustrating a state in which the semiconductor package of FIG. 4A is mounted on a main board.

FIG. 4B is a sectional view illustrating a state in which the semiconductor package 1 of FIG. 4A is mounted on the main board 90. In order to minimize the mounting area, the semiconductor package 1 is mounted in an inverted state on the main board 90 in such a manner that the exposed surfaces of the second leads 24B are in direct contact with lines formed on the main board 90. A sufficient mechanical strength is also obtained in the state in which the semiconductor package 1 is mounted on the main board 90 because the second leads 24B are firmly supported on the body 20. The mechanical strength can be enhanced where the upper surface of the resin encapsulate 40 is flush with the exposed upper surfaces of the second leads 24B. However, this configuration is not essential.

Figure 5A:
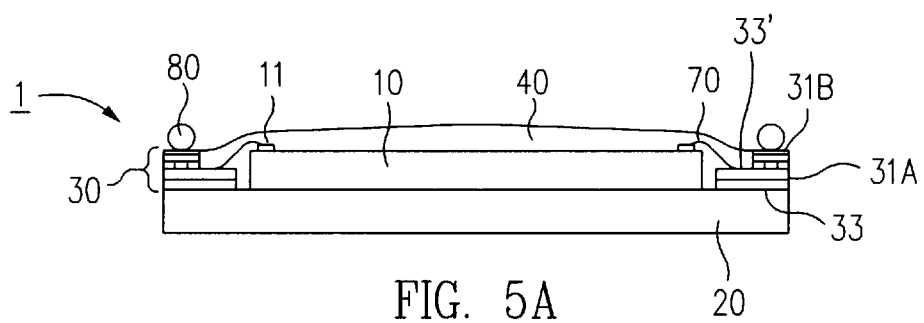
FIG. 5A is a sectional view illustrating another modified structure of the semiconductor package according to the first embodiment of the present invention.

FIG. 5A is a sectional view illustrating another modified structure of the semiconductor package 1 according to the first embodiment of the present invention. This package structure is basically identical to that of FIG. 4A.

In this case, a printed circuit board (PCB) 30 having a conventional structure is used in order to eliminate the troublesome bonding process required in the case of FIG. 4A to bond the first and second leads 24A and 24B, thereby achieving an improvement in the process efficiency. The PCB 30 has a multilayer structure including first and second conductive traces 31A and 31B bonded to each other by an insulating layer 33' interposed therebetween. The first and second conductive traces 31A and 31B are electrically connected to each other by conductive via holes 32.

In the case of FIG. 5A, the package body 20 has a flat structure as in the case of FIG. 4A. The PCB 30 is bonded to the upper surface of a peripheral portion of the body 20 by means of an insulating layer 33. The insulating layer 33 may be formed by coating an epoxy resin on the body 20. However, it is desirable in terms of the process efficiency that the insulating layer 33 is comprised of a double-faced electrical insulating tape. The insulating layer 33 and first conductive traces 31A are bonded to the upper surface of the peripheral portion of the body 20 around the semiconductor chip 10. The insulating layer 33' formed with the conductive via holes 32 and second conductive traces 31B have a length less than the length of the first conductive traces 31A. Each second trace 31B has an outer end extending to the outer end of an associated one of the first traces 31A. Preferably, the first and second conductive traces 31A and 31B are made of copper. Of course, these traces may be made of other materials.

The inner end of each first trace 31A adjacent to the semiconductor chip 10 is plated with silver in order to achieve an easy wire bonding. The silver-plated portion of each first trace 31A is electrically connected to an associated input/output pad 11 of the semiconductor chip 10 by a conductive wire 70.

Solder balls 80 may be used as input/output terminals of the package. In this case, a solder mask 34 is formed on the second conductive traces 31B in order to provide the solder balls 80 on the second conductive traces 31B. Alternatively, the second conductive traces 31B may be directly used as the input/output terminals. In this case, it is unnecessary to form the solder mask 34. In the case using the solder mask 34, namely, using the solder balls 80, a resin encapsulate 40 is molded in such a manner that its upper surface is positioned just below the upper surface of the solder mask 34. The resin encapsulate 40 protects the semiconductor chip 10, conductive wires 70 and first conductive traces 31A. The top of each solder ball 80 is positioned at a level higher than the upper surface of the resin encapsulate 40. This is desirable in that after the package is fused to a main board, the fused solder balls are flush with the resin encapsulate 40 (FIG. 5B).

Since the remaining configuration of this structure is basically identical to that of FIG. 4A, no detailed description thereof will be made.

Figure 5B:
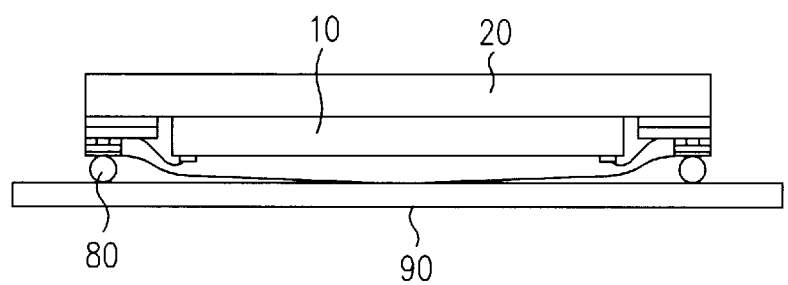
FIG. 5B is a sectional view illustrating a state in which the semiconductor package of FIG. 5A is mounted on a main board.

FIG. 5B is a sectional view illustrating a state in which the semiconductor package 1 of FIG. 5A is mounted on the main board 90. Referring to FIG. 5B, it can be found that the mounting area of the semiconductor package 1 on the main board 90 is minimized.

Figure 6:
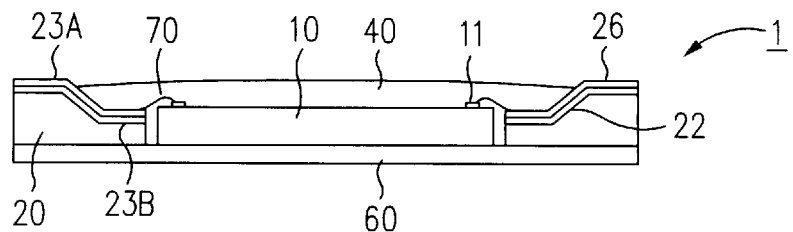
FIG. 6 is a sectional view illustrating a semiconductor package having a structure according to a second embodiment of the present invention.

FIG. 6 is a sectional view illustrating a semiconductor package having a structure according to a second embodiment of the present invention in order to accomplish the second object of the present invention.

This package structure is basically identical to that of the first embodiment except that it includes a thermally conductive plate 60. Accordingly, the package structure of the second embodiment will be described in conjunction with only the different configuration.

As shown in FIG. 6, the semiconductor package, which is denoted by the reference numeral 1, includes a package body 20 having a central opening. A thermally conductive plate 60 is bonded to the lower surface of the body 20 to close the opening of the body 20. The thermally conductive plate 60 has the same size as the body 20 so that its peripheral edge corresponds to the peripheral edge of the body 20. The inner side surface of the opening and the exposed upper surface portion of the thermally conductive plate 60 define a region having the same shape as that of the recess 21 in the case of the first embodiment. A semiconductor chip 10 is mounted in the region defined as mentioned above. Preferably, the thermally conductive plate 60 is made of a metal exhibiting a high thermal conductivity, such as aluminum, copper, or copper alloy. Where the body 20 is made of a metal exhibiting a high thermal conductivity, it is unnecessary for the plate 60 to be made of such a thermally conductive metal. Such a thermally conductive plate is advantageous in the case wherein the body 20 is made of ceramic or polymer resin.

Figure 7A:
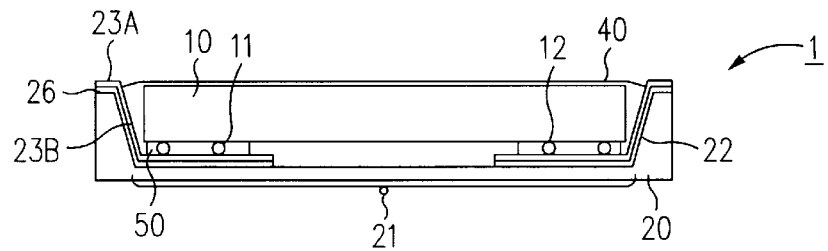
FIG. 7A is a sectional view illustrating a semiconductor package having a structure according to a third embodiment of the present invention.

FIGS. 7 and 8 illustrate a semiconductor package having a structure according to a third embodiment of the present invention in order to accomplish the third object of the present invention, respectively. FIG. 7A is a sectional view illustrating a basic structure of the semiconductor package according to the third embodiment of the present invention. As shown in FIG. 7A, the semiconductor package of the third embodiment, which is denoted by the reference numeral 1, includes a package body 20 provided at a central portion thereof with a recess 21 having inclined side surfaces 22, a semiconductor chip 10 mounted on the central portion of the body 20 in the recess 21, and outer and inner leads 23A and 23B supported on the upper surface of the body 20. An insulating layer 26 is interposed between the body 20 and each lead 23A or 23B. The semiconductor package 1 also includes bumps 12 for electrically connecting the inner leads 23B to input/output pads 11 of the semiconductor chip 10, respectively, and a resin encapsulate 40 for encapsulating the semiconductor chip 10, bumps 12 and inner leads 23B. The upper ends of the inclined surfaces 22 are positioned at a level flush with or higher than the upper surface of the semiconductor chip 10 so that the inclined surfaces 22 serve as a barrier for the resin encapsulate 40. The outer end of each outer lead 23A extends to the outer edge of the body 20 and is exposed.

The semiconductor package 1 of the third embodiment is similar to that of FIG. 2 according to the first embodiment, except that the semiconductor chip 10 and inner leads 23B are electrically connected by the bumps 12 in place of the conductive wires. Accordingly, no description will be made for the identical constituting elements.

Since the electrical connection between the semiconductor chip 10 and inner leads 23B is carried out using the bumps 12 (balls made of gold or solder) in accordance with a flip chip mounting method, the lengths and positions of the inner leads 23B depend on the positions of the bumps 12 on the input/output pads 11 of the semiconductor chip 10. Accordingly, it is unnecessary for the input/output pads 11 of the semiconductor chip 10 to be arranged on the peripheral portion of the semiconductor chip 10. The input/output pads 11 may be arranged on any portion of the upper surface of the semiconductor chip 10. For example, the input/output pads 11 may be arranged on the central portion of the semiconductor chip 10. Accordingly, there is an advantage in that a highly multi-pinned structure can be obtained. It is also possible to maintain a relatively large space between adjacent signal transfer lines while reducing a signal transfer path. Accordingly, an undesirable effect resulting from noise or interference can be reduced. Since no wire bonding process is required, there is a great advantage in obtaining a light, thin, simple and compact package structure.

The fusing of the bumps 12 on the input/output pads 11 of the semiconductor chip 10 may be carried out using a thermocompression bonding method, an ultrasonic bonding method or a solder bonding method.

The electrical and mechanical connection of the inner leads 23B to the bumps 130 on the input/output pads 11 of the semiconductor chip 10 are carried out using the well-known flip chip mounting method.

In accordance with the flip chip mounting method, the inner leads 23B are first accurately aligned with the bumps 12 of the semiconductor chip 10, respectively. The resulting package is then charged in a furnace and heated to a desired temperature so that the bumps 12 reflow on the inner leads 23B. In place of the flip chip mounting method, a bonding method using an anisotropic conductive film 50 may be used. Recently, this bonding method has been mainly used.

The anisotropic conductive film 50 is a film consisting of a general adhesive insulating film substrate internally contained with conductive metal grains (not shown). The adhesive film substrate has a thickness of about 50 μm whereas the conductive metal grains have a grain size of about 5 μm. The conductive metal grains are coated with a resin polymer thin film. When heat and pressure are applied to an optional portion of such an anisotropic conductive film 50, the resin polymer surrounding the conductive metal grains in the film portion is melted, thereby causing those conductive metal grains to exhibit the conductivity thereof. The remaining film portion, in which conductive metal grains are maintained in a state coated with the resin polymer thin film, maintains an insulation characteristic. Accordingly, where such an anisotropic conductive film is used, it is possible to achieve an easy positioning of objects to be electrically and mechanically connected to each other. By virtue of such a characteristic, the anisotropic conductive film is widely used for tape automated bonding (TAB), outer lead bonding (OLB) or chip on glass (COG).

Where the electrical and mechanical connection of the inner leads 23B to the input/output pads 11 of the semiconductor chip 10 are carried out using the anisotropic conductive film 50 having the above-mentioned characteristic, the anisotropic conductive film 50 is first bonded to each inner lead 23B or each bump 12 on the semiconductor chip 10.

Thereafter, the inner leads 23B are aligned with the bumps 12, respectively. Under this condition, the semiconductor chip 10 and inner leads 23B are thermally compressed.

Figure 7B:
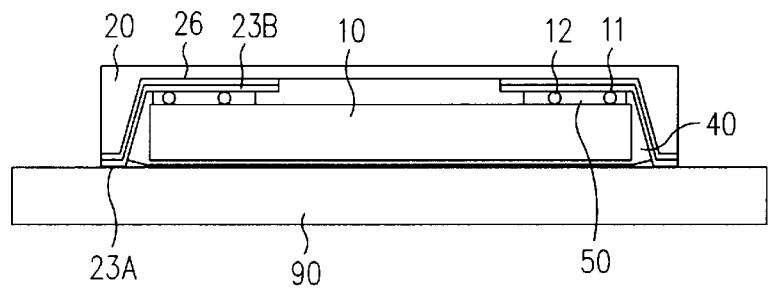
FIG. 7B is a sectional view illustrating a state in which the semiconductor package of FIG. 7A is mounted on a main board.

FIG. 7B is a sectional view illustrating a state in which the semiconductor package 1 of FIG. 7A is mounted on a main board. As shown in FIG. 7B, the exposed surfaces of the outer leads 23A, which are disposed outside the resin encapsulate 40 and supported on the peripheral portion of the body 20, are electrically connected to the main board denoted by the reference numeral 90. Accordingly, the area of the semiconductor package 1 occupied in the main board 90 is minimized, thereby maximizing the mounting density. Since the body 20 is exposed in the atmosphere, heat generated in the semiconductor chip 10 is easily discharged into the atmosphere. Accordingly, it is possible to maximize the performance of the semiconductor chip 10.

Now, the third embodiment of the present invention will be described in conjunction with structures respectively having DIP and QFP type lead arrangements shown in FIGS. 8A and 8B.

Figure 8A:
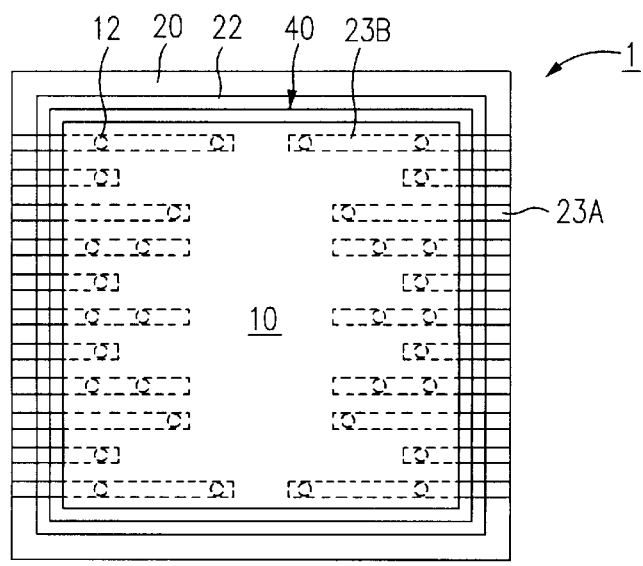
FIG. 8A is a partially-perspective plan view illustrating a DIP structure of the semiconductor package shown in FIG. 7A.

FIG. 8A is a partially-perspective plan view illustrating a DIP structure of the semiconductor package 1 shown in FIG. 7A. In this case, the outer and inner leads 23A and 23B extend along the upper surface of the body 20 which has the recess (not shown) defined as a chip mounting region by the inclined surfaces 22. The inner leads 23B are grouped into lead groups each having inner leads of a length different from those of the other lead groups. As shown in FIG. 8A, those of the inner leads 23B having different lengths extend inside the recess at opposite sides of the recess. In this case, accordingly, it is possible to arrange input/output pads 11 at optional positions on the semiconductor chip 10. In FIG. 8A, the reference numeral 40 denotes a resin encapsulate (namely, an encapsulate region).

Figure 8B:
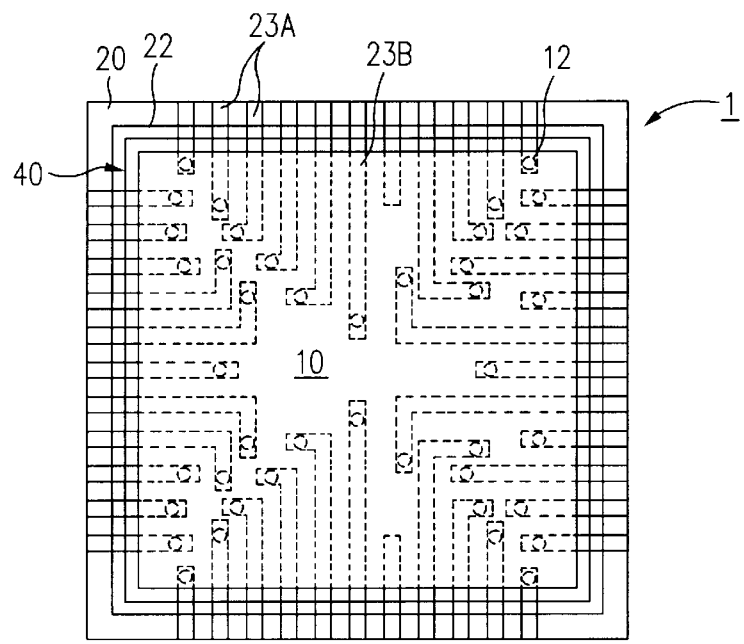
FIG. 8B is a partially-perspective plan view illustrating a QFP structure of the semiconductor package shown in FIG. 7A.

FIG. 8B is a partially-perspective plan view illustrating a QFP structure of the semiconductor package 1 shown in FIG. 7A. This structure is basically identical to that of FIG. 8A, except that the outer and inner leads 23A and 23B extend on four sides. Accordingly, no further description will be made for this structure. In the case of such a QFP type semiconductor package, it is possible to accommodate an increased number of terminals as compared to the DIP type semiconductor package. An increase in the freedom of design and an improvement in the performance are also achieved.

The remaining constituting elements of the semiconductor package 1 according to the third embodiment of the present invention are identical to those of FIG. 2. Accordingly, no further description will be made for such constituting elements.

Figure 9A:
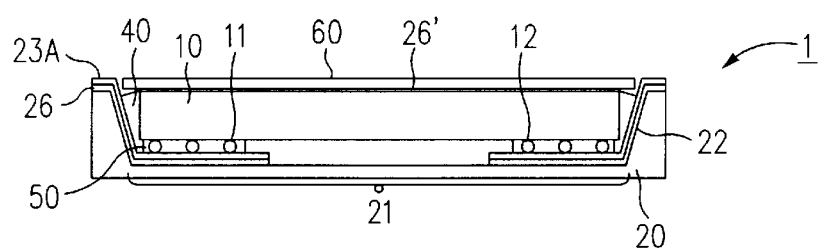
FIG. 9A is a sectional view illustrating a semiconductor package having a structure according to a fourth embodiment of the present invention.
Figure 9B:
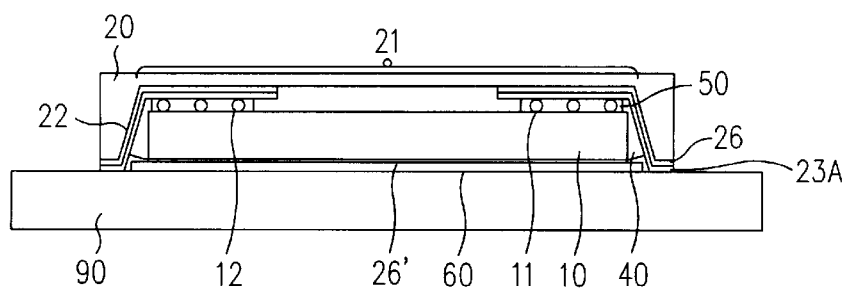
FIG. 9B is a sectional view illustrating a state in which the semiconductor package of FIG. 9A is mounted on a main board.
Figure 10A:
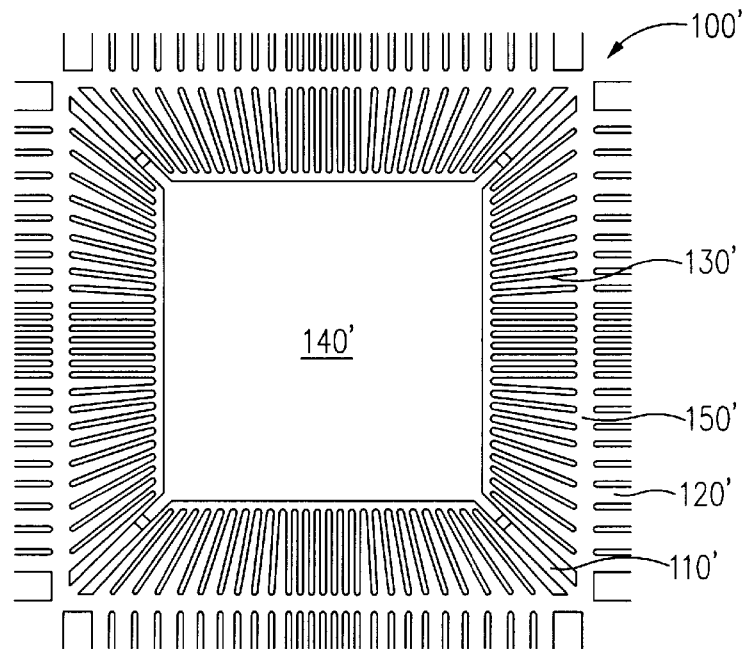
FIG. 10A is a plan view illustrating a general lead frame having a conventional structure.
Figure 10B:
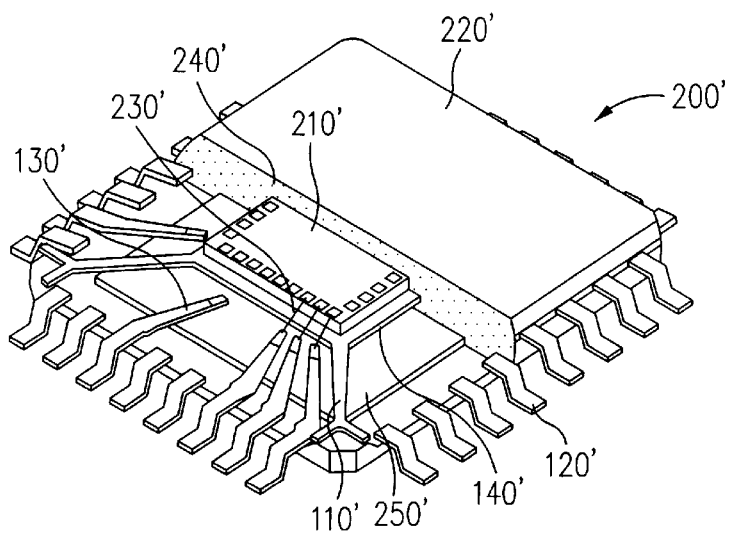
FIG. 10B is a partially-broken perspective view illustrating a QFP type semiconductor package fabricated using the lead frame of FIG. 10A.

FIG. 9A illustrates a semiconductor package having a structure according to a fourth embodiment of the present invention in order to accomplish the third object of the present invention whereas FIG. 9B illustrates a state in which the semiconductor package of FIG. 9A is mounted on a main board.

The package structure according to the fourth embodiment is basically identical to that of the third embodiment except that it includes a thermally conductive plate 60. Accordingly, the package structure of the fourth embodiment will be described in conjunction with only the different configuration.

In accordance with the fourth embodiment, the thermally conductive plate 60 is bonded to the semiconductor chip 10 by means of an insulating layer 26' in order to directly discharge heat generated in the semiconductor chip 10 toward a main board 90 on which the semiconductor package 1 is mounted. Preferably, the thermally conductive plate 60 has an appropriate thickness so that the upper surface thereof is positioned at a level lower than the upper surfaces of the outer leads 23A, in order to prevent the thermally conductive plate 60 from interfering with the connection of the outer leads 23A to the main board 90 upon mounting the semiconductor package 1 on the main board 90. Preferably, the exposed surface of the thermally conductive plate 60 is plated with solder to obtain a high bonding force to the main board 90. In this case, it is possible to further improve the heat discharge efficiency.

As apparent from the above description, the present invention provides a semiconductor package having a light, thin, simple and compact structure including outer leads having a minimum length and a resin encapsulate having a minimum volume. Where this semiconductor package is used, it is possible to maximize the mounting density of the semiconductor package on a main board while achieving an improvement in the heat discharge efficiency. In addition, there is an advantage in design in that the positions of input/output pads on a semiconductor chip can be optionally set.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor package comprising:
    a package body having an upper surface;
    a plurality of inner and outer leads bonded to the upper surface of the body by an insulating layer in such a manner that the plurality of leads are supported on the upper surface of the package body;
        a semiconductor chip mounted on a central portion of the body;
        electrical connection means for electrically connecting the plurality of inner leads to the semiconductor chip;
        a resin encapsulate for encapsulating the semiconductor chip, the electrical connection means and the plurality of inner leads;
        wherein each of the plurality of outer leads has an end positioned at a level higher than an upper surface of the semiconductor chip so that the plurality of inner and outer leads which are divided at a surface of the resin encapsulate are integrally formed and,
        wherein the plurality of outer and inner leads each define a boundary portion which defines a margin for the resin encapsulate, the end of each of the plurality of outer leads being exposed outside the resin encapsulate and extending at most to a peripheral edge of the body.

2. The semiconductor package in accordance with claim 1, wherein the insulating layer comprises an electrically insulating tape, and the ends of the plurality of outer leads, which serve as input/output terminals, are plated with solder.

3. The semiconductor package in accordance with claim 1, wherein the package body is made of a material selected from the group consisting of a metal, a ceramic, and a polymer resin.

4. The semiconductor package in accordance with claim 1, wherein the ends of the outer leads are positioned at a level flush with an upper surface of the resin encapsulate.

5. The semiconductor package in accordance with claim 1, wherein:

the body has an upwardly inclined surface formed around a semiconductor chip mounting region defined on the central portion of the body while being spaced from the semiconductor chip mounting region by a desired distance, and a flat surface extending outwardly from the inclined surface;

the plurality of inner and outer leads extend along an upper surface of a portion of the body, except for the semiconductor chip mounting region, extending from a position near a peripheral edge of the region to the peripheral edge of the body in such a manner that the profile of the inner and outer leads corresponds to the profile of the upper surface of the body;

the resin encapsulate has a peripheral edge disposed on the inclined surface; and the electrical connection means comprises conductive wires.

6. The semiconductor package in accordance with claim 5, wherein:

the body is made of a polymer resin;

the body is provided at its central portion with an opening;

the body is attached at a lower surface thereof with a thermally conductive plate having the same size as the body in such a manner that a peripheral edge of the thermally conductive plate corresponds to the peripheral edge of the body, the thermally conductive plate closing the opening; and the semiconductor chip is mounted on an exposed portion of the thermally conductive plate in the opening.

7. The semiconductor package in accordance with claim 5, wherein:

the body has a recess formed at the central portion of the body and adapted to mount the semiconductor chip therein while having a vertical side wall perpendicular to a bottom surface of the recess, an upwardly inclined surface formed around the recess while being spaced from a peripheral edge of the recess by a desired distance, and a flat surface extending outwardly from the inclined surface; and the plurality of inner and outer leads extend along an upper surface of a portion of the body, except for the recess, extending from a peripheral edge of the recess to the peripheral edge of the body in such a manner that the profile of the plurality of inner and outer leads corresponds to the profile of the upper surface of the body.

8. The semiconductor package in accordance with claim 1, wherein:

the body has a recess formed at the central portion of the body and adapted to mount the semiconductor chip therein, an upwardly inclined surface formed around the recess and adapted to define the recess, and a flat surface extending outwardly from an upper end of the inclined surface;

the semiconductor chip has conductive bumps respectively arranged on input/output pads thereof;

the plurality of inner and outer leads extend along the upper surface of the body from an interior of the recess to the peripheral edge of the body in such a manner that the profile of the inner and outer leads corresponds to the profile of the upper surface of the body;

the plurality of inner leads have portions extending inside the recess, respectively;

the semiconductor chip is mounted on the portions of the inner leads extending inside the recess;

the resin encapsulate has a peripheral edge disposed on the inclined surface; and the electrical connection means comprises the conductive bumps.

9. The semiconductor package in accordance with claim 8, further comprising a thermally conductive plate bonded to the upper surface of the semiconductor chip by an insulating layer and adapted to directly discharge heat generated in the semiconductor chip toward a main board on which the semiconductor package is mounted.

10. The semiconductor package in accordance with claim 8, wherein the plurality of inner leads are grouped into lead groups each having inner leads of a length different from those of the other lead groups, and those of the inner leads having different lengths extend inside the recess at different sides of the recess, respectively.

11. The semiconductor package in accordance with claim 10, wherein the electrical connection means of the plurality of inner leads comprises an anisotropic conductive film, the plurality of inner leads being grouped into lead groups each having inner leads of a length different from those of input/output pads.

12. A semiconductor package comprising:

a semiconductor chip;

a flat package body centrally defined with a semiconductor chip mounting region, the body having an area larger than the semiconductor chip;

a printed circuit board bonded to a peripheral portion of the body outside the semiconductor chip mounting region in such a manner that an upper surface thereof is positioned at a desired level, the printed circuit board having first and second conductive traces laminated together and an insulating layer interposed between the first and second conductive traces and provided with conductive via holes adapted to electrically connect the first and second conductive traces to each other;

conductive wires for electrically connecting the second traces to the semiconductor chip;

a resin encapsulate for protecting the insulating layer, the first conductive traces, the semiconductor chip, and the conductive wires from the environment; and the ends of the second traces being positioned at a level higher than an upper surface of the semiconductor chip so that a boundary portion defined between the associated first and second traces serves as a barrier for the resin encapsulate, the ends of the second traces being also exposed outside the resin encapsulate and extending to a peripheral edge of the body.

13. The semiconductor package in accordance with claim 12, wherein the insulating layer interposed between the package body and the printed circuit board comprises an electrically insulating tape, and the package body is made of a material selected from the group consisting of a metal, a ceramic, and a polymer resin.

14. The semiconductor package in accordance with claim 12, further comprising solder balls fused on upper surfaces of the second conductive traces and adapted as external input/output terminals, respectively, the solder balls having tops positioned at a level higher than an upper surface of the resin encapsulate.

15. The semiconductor package in accordance with claim 12, wherein the second traces are positioned at a level flush with an upper surface of the resin encapsulate.

16. A semiconductor package comprising:

a package body having an upper surface and plurality of side walls defining peripheral edges of the package body;

a plurality of inner and outer leads formed on or above the upper surface of the package body and in electrical connection with each other and with each of the plurality of outer leads, with an input/output electrical contact point formed on a portion of each of the outer leads;

a semiconductor chip mounted on a central portion of the package body;

an electrical connection electrically connecting the plurality of inner leads to the semiconductor chip; and a resin encapsulate encapsulating the semiconductor chip, the electrical connection, the plurality of inner leads, and the electrical connection between the inner and outer leads;

wherein a margin of the resin encapsulate is at a location that leaves the input/output electrical contact on each of the plurality of outer leads exposed outside the resin encapsulate, and wherein each of the outer leads extends no further than the respective peripheral edge of the package body.

17. The semiconductor package in accordance with claim 16, wherein the inner and outer leads are separated from the package body by an insulating layer which comp rises an electrically insulating tape, and wherein the input/output electrical contact points are plated with solder.

18. The semiconductor package in accordance with claim 16, wherein the package body is made of a material selected from the group consisting of a metal, a ceramic, and a polymer resin.

19. The semiconductor package in accordance with claim 16, wherein the input/output electrical contact points are positioned at a level flush with an upper surface of the resin encapsulate.

20. The semiconductor package in accordance with claim 16, wherein:

the body has an upwardly inclined surface formed around the central portion while being spaced from the semiconductor chip mounting region by a desired distance and a flat surface extending outwardly from the inclined surface;

the plurality of inner and outer leads extend along an upper surface of a portion of the body, except for the central portion, extending from a position near a peripheral edge of the central portion to the peripheral edge of the package body in such a manner that the profile of the inner and outer leads corresponds to the profile of the upper surface of the package body; and the margin of the resin encapsulate terminates on the inclined surface.

21. The semiconductor package in accordance with claim 20, wherein:

the body is made of a polymer resin;

the body is provided at its central portion with an opening;

the body is attached at a lower surface thereof with a thermally conductive plate contained at its peripheral edges within the peripheral edge of the package the body such that the peripheral edge of the thermally conductive plate does not extend outside of the peripheral edge of the package body and extends with the thermally conductive plate closing the opening; and the semiconductor chip is mounted on an exposed portion of the thermally conductive plate within the opening.

22. The semiconductor package in accordance with claim 20 wherein:

the body has a recess formed at the central portion of the body and adapted to mount the semiconductor chip therein while having a vertical side wall perpendicular to a bottom surface of the recess, with an upwardly inclined surface formed around the recess and being spaced from a peripheral edge of the recess by a desired distance and with a flat surface extending outwardly from the inclined surface; and the plurality of inner and outer leads extend above an upper surface of a portion of the package body, except for the recess, extending from a peripheral edge of the recess to no more than the peripheral edge of the package body in such a manner that the outer leads do not extend on the flat surface beyond the respective peripheral edge of the package body.

23. The semiconductor package in accordance with claim 16, wherein:

the body has a recess formed at the central portion of the body and adapted to mount the semiconductor chip therein, an upwardly inclined surface formed around the recess and adapted to define the recess, and a flat surface extending outwardly from an upper end of the inclined surface;

the semiconductor chip has conductive bumps respectively arranged on input/output pads thereof;

the plurality of inner and outer leads extend above the upper surface of the package body from an interior of the recess to no more than the peripheral edge of the body in such a manner that the outer leads do not extend on the flat surface beyond the respective peripheral edge of the package body;

wherein the plurality of inner leads have portions extending inside the recess;

the semiconductor chip is mounted on the portions of the inner leads extending inside the recess; and, the margin of the resin encapsulate terminates on the inclined surface.

24. The semiconductor package in accordance with claim 23, further comprising a thermally conductive plate bonded to the upper surface of the semiconductor chip by an insulating layer and adapted to directly discharge heat generated in the semiconductor chip toward a main board on which the semiconductor package is mounted.

25. The semiconductor package in accordance with claim 23, wherein the plurality of inner leads are grouped into lead groups each having inner leads of a length different from those of the other lead groups, and those of the inner leads having different lengths extend inside the recess at different sides of the recess, respectively.

26. The semiconductor package in accordance with claim 25, wherein the electrical connection means of the plurality of inner leads comprises an anisotropic conductive film, the plurality of inner leads being grouped into lead groups each having inner leads of a length different from those of input/output pads.

27. A semiconductor package comprising:

a semiconductor chip;

a flat package body containing a central portion defining a semiconductor chip mounting region, the mounting region being of a size to accommodate mounting the semiconductor chip;

a multiple-ply laminate bonded to a peripheral portion of the flat package body outside the semiconductor chip mounting region in such a manner that an upper surface of an upper ply thereof is positioned at a desired level, the multiple-ply laminate having first and second conductive traces formed thereon and an insulating layer interposed between the first and second conductive traces, and being provided with conductive via holes adapted to electrically connect the first and second conductive traces to each other;

conductive wires for electrically connecting the second traces to the semiconductor chip;

a resin encapsulate for protecting the insulating layer, the first conductive traces, the semiconductor chip, and the conductive wires from the environment; and ends of the second traces being positioned at a level higher than an upper surface of the semiconductor chip so that at least a portion of the second traces are exposed outside of the resin encapsulate and extending to no more than a respective peripheral edge of the flat package body.

28. The semiconductor package in accordance with claim 27, wherein the insulating layer interposed between the package body and the printed circuit board comprises an electrically insulating tape, and wherein the package body is made of a material selected from the group consisting of a metal, a ceramic, and a polymer resin.

29. The semiconductor package in accordance with claim 28, further comprising solder balls fused on upper surfaces of the second conductive traces and adapted as external input/output terminals, respectively, the solder balls having tops positioned at a level higher than an upper surface of the resin encapsulate.

30. The semiconductor package in accordance with claim 28, wherein the second traces are positioned at a level flush with an upper surface of the resin encapsulate.

* * * * *

UNITED STATES PATENT AND TRADEMARK OFFICE
CERTIFICATE OF CORRECTION

PATENT NO.   : 5,986,334
ISSUE DATE   : 11/16/99
INVENTOR(S)  : Lee, Seon Goo

It is certified that error appears in the above-identified patent and that said Letters Patent is hereby corrected as shown below:

On the Title page Item [73], Assignees should read as follows:

--Anam Semiconductor Inc., Seoul, Korea and Amkor Technology, Inc., Chandler, Ariz.--

Signed and Sealed this

First Day of August, 2000

Attest:

Attesting Officer

Q. TODD DICKINSON

Director of Patents and Trademarks